US005963285A

United States Patent [19]

Kim

[11] Patent Number: 5,963,285

[45] Date of Patent: Oct. 5, 1999

[54] LIQUID CRYSTAL DISPLAY WITH IMPROVED ELECTRODE ADHESION AND METHOD FOR MANUFACTURING SAME

[75] Inventor: Woong Kwon Kim, Kyunggi-do, Rep. of Korea

[73] Assignee: LG Electronics Inc., Seoul, Rep. of Korea

[21] Appl. No.: 09/080,267

[22] Filed: May 18, 1998

[30] Foreign Application Priority Data

Nov. 5, 1997 [KR] Rep. of Korea ...................... 97-58219

[51] Int. Cl.[6] ......................... G02F 1/1333; H01L 23/58; H01L 23/48

[52] U.S. Cl. .......................... 349/122; 349/138; 257/642; 257/643; 257/752

[58] Field of Search .................................... 349/122, 138; 257/754, 752, 642, 643; 438/623, 626, 631, 780; 287/40, 642, 643

[56] References Cited

U.S. PATENT DOCUMENTS

| | | | |
|---|---|---|---|
| 5,032,883 | 7/1991 | Wakai et al. | 357/23.7 |
| 5,585,951 | 12/1996 | Noda et al. | 349/122 |
| 5,721,601 | 2/1998 | Yamaji et al. | 349/138 |

FOREIGN PATENT DOCUMENTS

| | | |
|---|---|---|
| 63-279228 | 11/1988 | Japan . |
| 4163528 | 6/1992 | Japan . |
| 404320217 | 11/1992 | Japan . |

OTHER PUBLICATIONS

Radler et al, Cyclotene Advanced Electronics Resins for High–Aperture AMLCD Applications, SID 96 Aaplications Digest, pp. 33–36, 1996.

Perettie et al, Benzocyclobutene as a Planarization Overcoat for Flat Panel Displays, Asia Display, pp. 721–724, 1995.

*Primary Examiner*—William L. Sikes
*Assistant Examiner*—Tarifur R. Chaudhury
*Attorney, Agent, or Firm*—Morgan, Lewis & Bockius LLP

[57] ABSTRACT

A method for manufacturing a liquid crystal display device includes the steps of forming a switching element having an electrode on substrate, forming an organic layer over the substrate and the switching element, forming an ion doped layer by doping ions selected from a group consisting of Si, P, Ge, B, As, Ba, Ti, Tb, and Bi into the organic layer, forming a contact hole in the ion doped layer exposing a portion of the electrode, and forming an inorganic layer connected to the electrode through the contact hole on the ion doped layer.

19 Claims, 6 Drawing Sheets

170a 192a 190 170b 130 156 188a
170 160 192b 150 155 110

LIQUID CRYSTAL DISPLAY WITH IMPROVED ELECTRODE ADHESION AND METHOD FOR MANUFACTURING SAME

This application claims the benefit of Korean patent application No. 97/58219, filed Nov. 5, 1997, which is hereby incorporated by reference.

BACKGROUND OF THE INVENTION

1. Field of the Invention

The present invention relates to a liquid crystal display device (LCD) and a method for manufacturing the same, and more particularly, to a method for improving adhesion between an organic layer and a pixel electrode of an LCD.

2. Discussion of the Related Art

Generally, a conventional liquid crystal display device includes two panels with a liquid crystal layer between them. A first panel (an active panel) of the LCD includes switching elements such as thin film transistors (TFTs) and pixel electrodes. A second panel (a color filter panel) of the LCD includes color filters and common electrodes.

Referring to FIGS. 1A and 1B, a conventional LCD having a reversed stagger type thin film transistor (TFT) and a method for manufacturing the same will be described.

As shown in FIG. 1A, a gate electrode 60 is formed on a transparent substrate 10. A gate insulation layer 50 is formed on the transparent substrate 10 covering the gate electrode 60. A semiconductor layer 90 is formed on the gate insulation layer 50 over the gate electrode 60. First and second doped semiconductor layers 92*a* and 92*b* are formed on the semiconductor layer 90 in separate regions. A source electrode 70*a* is formed on the first doped semiconductor layer 92*a* in ohmic contact with the semiconductor layer 92*a*. A data line 70 connected to the source electrode 70*a* is formed on the gate insulation layer 50. A drain electrode 70*b* is in ohmic contact with the second doped semiconductor layer 92*b*. Therefore, a switching element of the LCD (i.e., the TFT), is formed on the transparent substrate 10. An organic protection layer 55 including benzo-cyclo-butene is deposited on the transparent substrate 10 and the TFT. A contact hole 30*a* is formed in the organic protection layer 30 in order to expose a portion of the drain electrode 70*b*. A pixel electrode 40 is formed on the organic protection layer 30. The pixel electrode 40 is connected to the drain electrode 70*b* through the contact hole 30*a*.

The organic protection layer 55 is used because the surface of the organic protection layer 55 is planar after being coated onto an uneven surface of the transparent substrate 10 and the TFT, and because the organic protection layer 55 has a lower dielectric constant than an inorganic material. Therefore, the pixel electrode 40 can be made larger, overlapping the data line 70. Thus, an organic material is used as a protection layer for an LCD having a high aperture ratio. A photo-resist pattern 88 for patterning the pixel electrode 40 is extended until it overlaps a portion of the data line 70, as shown in FIG. 1A.

When the pixel electrode 40 is formed by etching an indium tin oxide (ITO) layer using photo-lithography, an edge of the ITO layer can be attacked by an etchant, because vacancies result from weak adhesion between the ITO layer and the organic protection layer. Therefore, the etchant attacks the vacancies, and the pixel electrode 40 is over-etched. FIG. 1B shows etching results after the pixel electrode 40 is formed using the conventional method. Element A in FIG. 1B shows a peeled portion of the pixel electrode and elements B and C show over-etched portions of the pixel electrode 40.

SUMMARY OF THE INVENTION

Accordingly, the present invention is directed to a liquid crystal display device (LCD) and a method for manufacturing the same that substantially obviates one or more of the problems due to the limitations and disadvantages of the related art.

One object of the present invention is to provide a method for a manufacturing a liquid crystal display device having an organic layer and an inorganic layer where adhesion between the organic layer and the inorganic layer is improved.

Another object is to improve etching results of the inorganic layer formed over the organic layer.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these and other advantages and in accordance with the purpose of the present invention, as embodied and broadly described, in accordance with a first aspect of the present invention there is provided a method for manufacturing a liquid crystal display device including the steps of forming a switching element having an electrode on substrate, forming an organic layer over the substrate and the switching element, forming an ion doped layer by doping ions selected from a group consisting of Si, P, Ge, B, As, Ba, Ti, Tb, and Bi into the organic layer, forming a contact hole in the ion doped layer exposing a portion of the electrode, and forming an inorganic layer connected to the electrode through the contact hole on the ion doped layer.

In another aspect of the present invention there is provided a liquid crystal display device including a substrate, a switching element having an electrode on the substrate, an organic layer over the switching element and the substrate, an ion doped layer including ions selected from Si, P, Ge, B, As, Ba, Ti, Tb, and Bi on the organic layer, a contact hole in the ion doped layer exposing the electrode, and an inorganic layer connected to the electrode through the contact hole.

In another aspect of the present invention there is provided a liquid crystal display device including an organic layer including at least one of a C—H and a C—F bond structure on a substrate, a doped layer on the organic layer including ions selected from a group of ions consisting of Si, P, Ge, B, As, Ba, Ti, Tb and Bi, and an inorganic layer formed on the doped layer.

In another aspect of the present invention there is provided a method of forming liquid crystal display device including the steps of forming a thin film transistor having an electrode on a substrate, forming an organic protection layer over the thin film transistor and the substrate, doping a surface portion of the organic protection layer with ions selected from a group consisting of Si, P, Ge, B, As, Ba, Ti, Tb, and Bi to form an ion doped layer, forming a contact hole in the organic protection layer and the ion doped layer to expose the electrode, and forming a pixel electrode in the contact hole and over a portion of the ion doped layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

First Preferred Embodiment

Figure 2A:
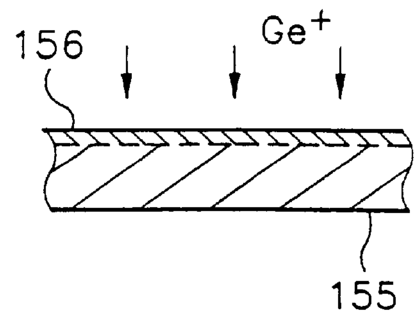
FIGS. 2A and 2B show an organic layer and a doped organic layer.
Figure 2B:
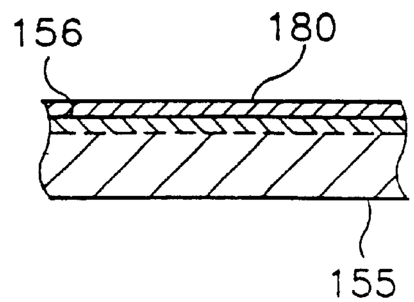
Figure 3A:
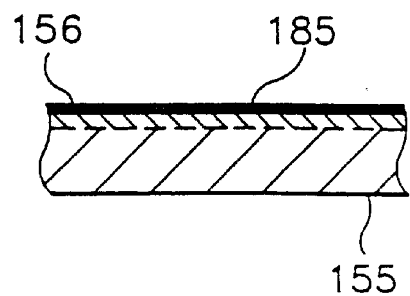
FIGS. 3A and 3B show formation of an ashing layer between the doped organic layer and the inorganic layer.
Figure 3B:
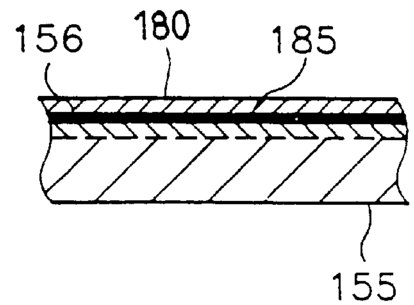
Figure 4A:
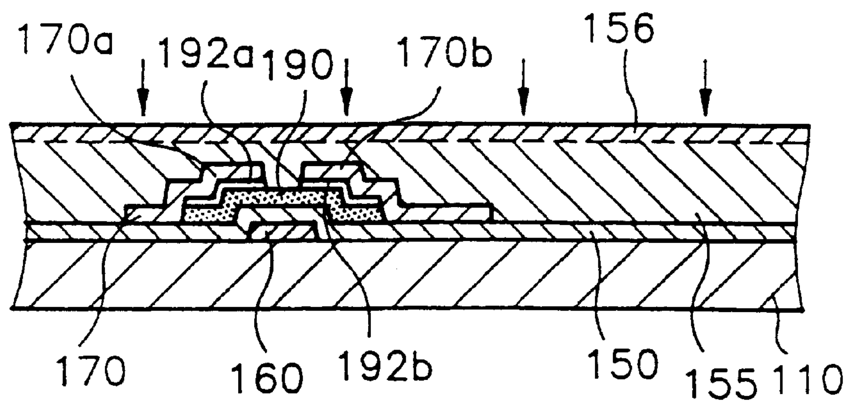
FIGS. 4A–4D are cross-sectional views showing the first embodiment of the present invention with the ion doped layer formed between the organic layer and the inorganic layer.

As shown in FIGS. 2A and 4A, an organic layer 155, such as a BCB (benzo-cyclo-butene) layer having a C—H or a C—F bonding structure, is formed on a substrate 110. An ion doped layer 156 is formed by doping impurities such as e.g., germanium (Ge) ions into a top surface of the organic layer 155, as shown in FIG. 2A. An inorganic layer 180, such as an ITO layer, a silicon oxide layer, and a silicon nitride layer are formed on the ion doped layer 156, as shown in FIG. 2B. In order to enhance the adhesion between the organic layer 155 and the inorganic layer 180, it is preferable to ash the surface of the ion doped layer 156 with $O_2$ to form an oxide layer 185, as shown in FIG. 3A. After that an inorganic layer 180 may be deposited on the oxide layer 185, as shown in FIG. 3B. Additionally, the ion doped layer 156 may also be formed by doping silicon (Si), phosphorous (P), boron (B), germanium (Ge), arsenic (As), barium (Ba), titanium (Ti), terbium (Tb), or bismuth (Bi) ions.

Referring to FIGS. 4A–4D, a gate electrode 160 is formed on a transparent substrate 110. A gate insulation layer 150 covering the gate electrode 160 is formed on the transparent substrate 110. A semiconductor layer 190 is formed on the gate insulation layer 150 over the gate electrode 160. First and second doped semiconductor layers 192*a* and 192*b* are formed on the semiconductor layer 190 in separate regions. A source electrode 170*a* is formed over the first doped semiconductor layer 192*a* and in ohmic contact with the first doped semiconductor layer 192*a*. A data line 170 connected to the source electrode 170*a* is formed on the gate insulation layer 150. A drain electrode 170*b* is formed on the second doped semiconductor layer 192*b* and in ohmic contact with the second doped semiconductor layer 192*b*. As shown in FIG. 4A, the organic protection layer 155 is formed by a spin coating method using an organic material such as benzo-cyclo-butene having a C—H or a C—F bond. Ions selected from Ge, Si, P, B, As, Ba, Ti, Tb, or Bi are doped into a surface of the organic protection layer 155 to form the ion doped layer 156.

Figure 4B:
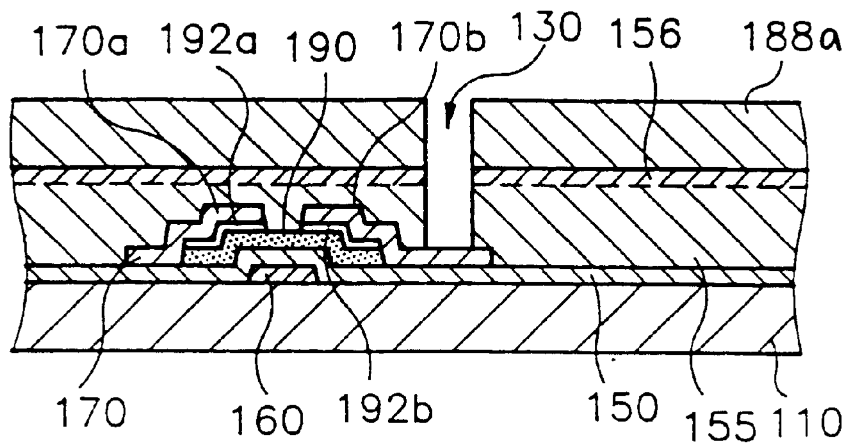

As shown in FIG. 4B, a first photo-resist layer is coated on the ion doped layer 156. The first photo-resist layer is exposed to ultraviolet light using a mask having a contact hole pattern, and developed to form a photo-resist pattern 188*a* having a contact hole pattern exposing a portion of the ion doped layer 156 and a portion of the organic protection layer 155 covering the drain electrode 170*b*. The exposed portion of the ion doped layer 156 and the organic protection layer 155 are etched together with the photo-resist pattern 188*a* to form a contact hole 130, as shown in FIG. 4B.

Figure 4C:
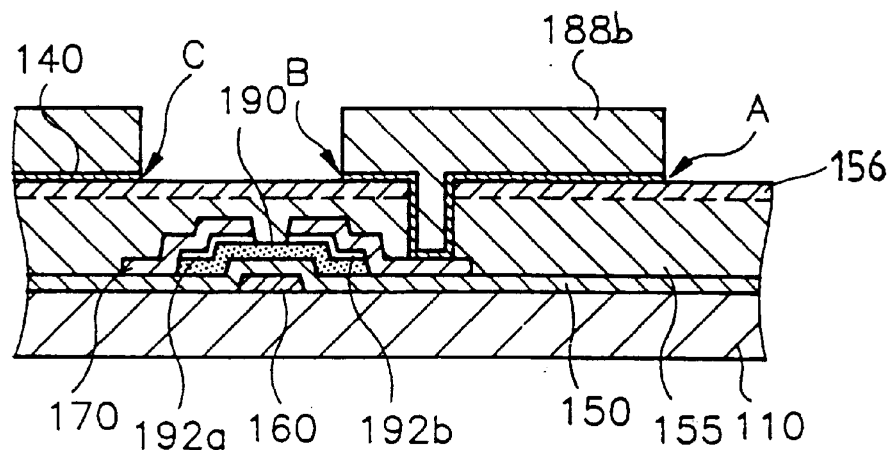
Figure 4D:
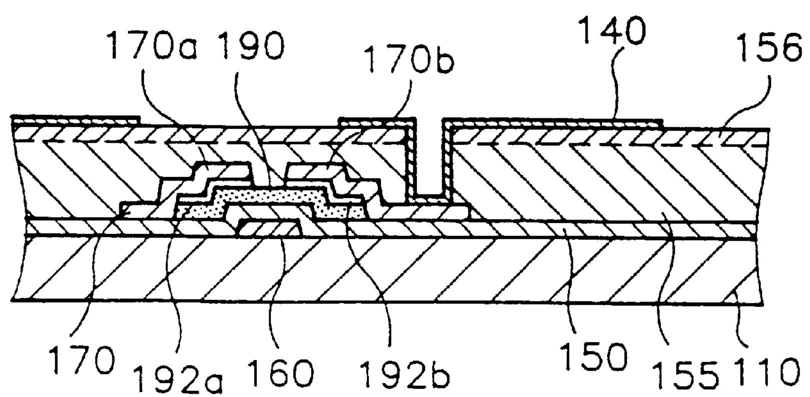

As shown in FIG. 4C, the photo-resist pattern 188*a* is removed. An indium tin oxide (ITO) layer is deposited by a sputtering method. A second photo-resist layer is deposited over the ITO layer. The second photo-resist layer is exposed to ultraviolet light using a mask having a pixel electrode pattern, and developed to form a photo-resist layer 188*b* having the pixel electrode pattern. The ITO layer is patterned along with the photo-resist pattern 188*b* to form a pixel electrode 140 connected to the drain electrode 170*b* through the contact hole 130, as shown in FIG. 4C. The photo-resist layer 188*b* is then removed, as shown in FIG. 4D.

Figure 1A:
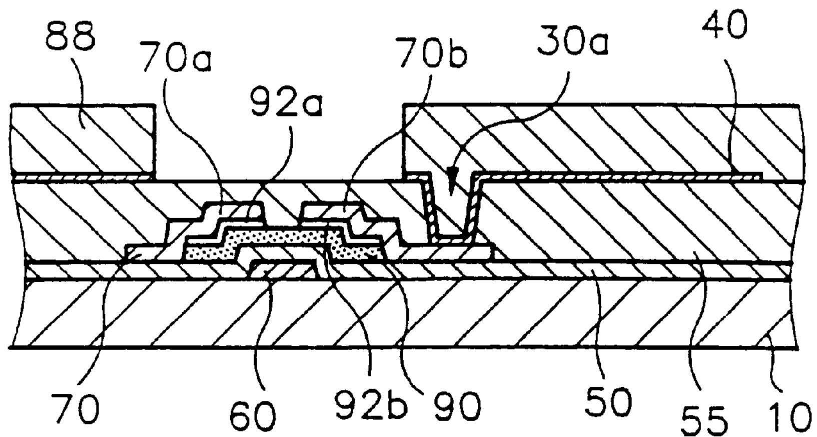
FIGs. 1A and 1B are cross-sectional views showing the conventional method for manufacturing a pixel electrode on an organic layer covering a thin film transistor.
Figure 1B:
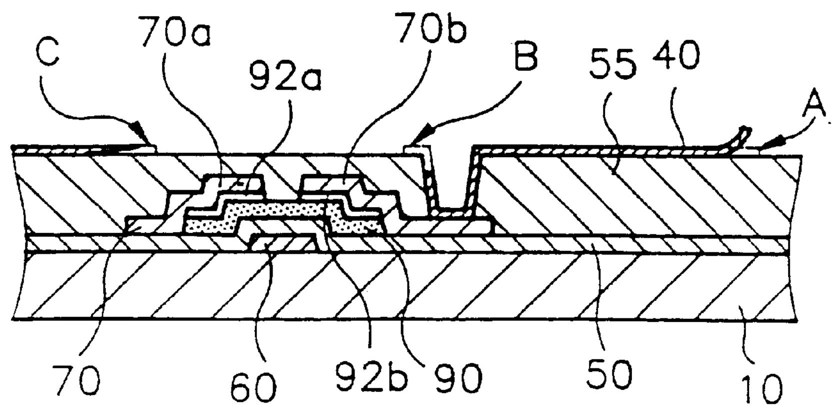

In the first embodiment, the etchant does not attack the edge portions of the patterned pixel electrode, i.e., portions corresponding to elements A, B, and C of FIG. 1B, because adhesion between the ITO layer and the organic protection layer 155 is improved, thus improving an etching result of the pixel electrode 140.

Second Preferred Embodiment

Figure 5A:
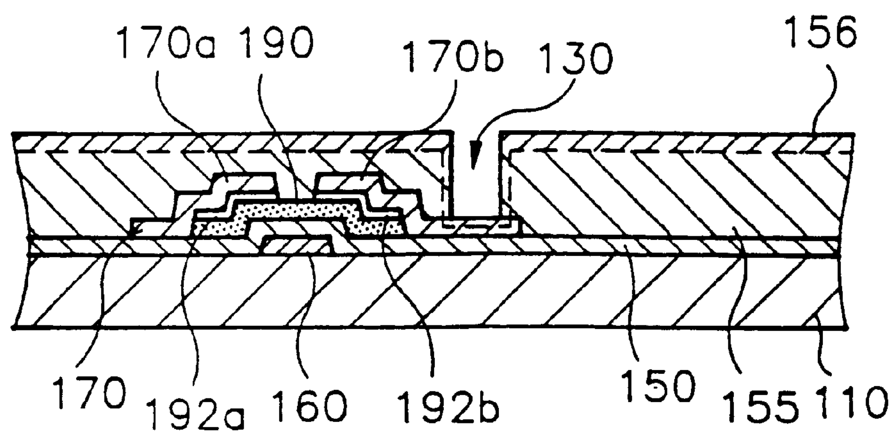
FIGS. 5A–5C are cross-sectional views showing the second embodiment of the present invention with the ion doped layer formed between the organic layer and the inorganic layer.
Figure 5B:
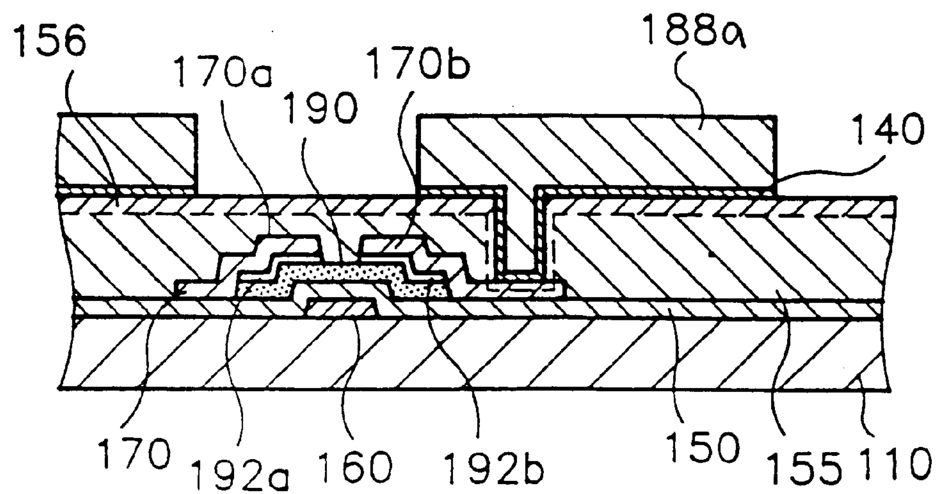
Figure 5C:
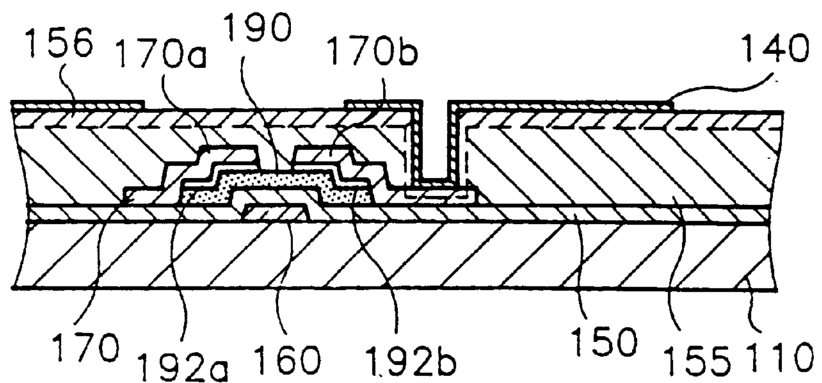

Referring to FIGS. 5A–5C, a second embodiment of the present invention will be described. The second embodiment is similar to the first embodiment, except that, after the organic protection layer 155 is coated onto a substrate 110 including a TFT structure similar to that of the first preferred embodiment, a contact hole is formed prior to forming an ion doped layer.

An organic protection layer 155 is formed on the substrate 110 including the TFT by a spin coating method using an organic material such as benzo-cyclo-butene having a C—H or a C—F bond. The organic protection layer 155 is patterned to form a contact hole 130 exposing a portion of a surface of the drain electrode 170*b*. Ions selected from Ge, Si, P, B, As, Ba, Ti, Tb, or Bi are doped into a surface of the organic protection layer 155 and the contact hole 130 to form an ion doped layer 156. The ion doped layer 156 is also formed at side walls of the contact hole 130, as shown in FIG. 5A.

As shown in FIG. 5B, an indium tin oxide (ITO) layer is deposited by sputtering on the ion doped layer 156. A photo-resist layer is coated over the ITO layer. The photo-resist layer is exposed to ultraviolet light using a mask having a pixel electrode pattern, and developed to form a photo-resist pattern 188*a* having a pixel electrode pattern. The ITO layer is patterned along with the photo-resist pattern 188 to form a pixel electrode 140 connected to the drain electrode 170*b* through the contact hole 130.

The photo-resist pattern 188*a* is removed, as shown in FIG. 5C, completing an LCD active panel having improved adhesion between the organic protection layer 155 and the pixel electrode 140, similar to the first preferred embodiment. In the second preferred embodiment, adhesion of the pixel electrode 140 to the etched side wall of the contact hole 130 that includes an organic material is also improved. Therefore, contact resistance between the drain electrode 170*b* and the pixel electrode 140 in the contact hole 130 is low.

Third Preferred Embodiment

Figure 6:
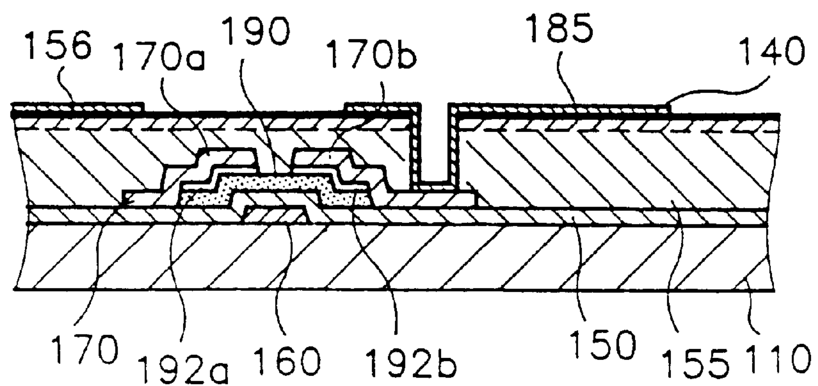
FIG. 6 is a cross-sectional view showing a third embodiment of the present invention with an oxide layer formed between the ion doped layer and the inorganic layer.

Referring to FIG. 6, a third embodiment of the present invention will be described. In the third embodiment, after an ion doped layer is formed on a surface of an organic protection layer as in the first embodiment, an oxide layer is formed on the ion doped layer.

An organic protection layer 155 is formed on the substrate 110 including a TFT (similar to the first embodiment) by a spin coating method using an organic material such as a benzo-cyclo-butene having a C—H or a C—F bond. Ions selected from Ge, Si, P, B, As, Ba, Ti, Tb, or Bi are doped into a surface of the organic protection layer 155 to form an ion doped layer 156. An oxide layer 185 is formed by ashing a surface of the ion doped layer 156 in an $O_2$ atmosphere. A contact hole 130 is formed exposing a portion of a surface of the drain electrode 170*b*. A pixel electrode 140 is formed connected to the drain electrode 170*b* through the contact hole 130, as shown in FIG. 6. In the third embodiment, adhesion between the organic protection layer 155 and the pixel electrode 140 is further improved because of the oxide layer 185.

The present invention improves the adhesion between an organic layer such as a benzo-cyclo-butene layer and an inorganic layer such as an ITO layer. The present invention also provides a method for improving the adhesion between the organic layer and the inorganic layer by doping ions selected from Si, P, Ge, B, As, Ba, Ti, Tb, or Bi into the organic layer. Therefore, the pixel electrode 140 will not peel off from the organic protection layer 155. Additionally, an edge of the inorganic layer is protected from overetch due to an attack of the etchant. Consequently, the pixel electrode 140 has a shape as intended.

While the invention has been described in detail and with reference to specific embodiments thereof, it will be apparent to those skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A method for manufacturing a liquid crystal display device comprising the steps of:

forming a switching element having an electrode on a substrate;

forming an organic layer over the substrate and the switching element;

forming an ion doped layer by doping ions selected from a group consisting of Si, P, Ge, B, As, Ba, Ti, Tb, and Bi into a top portion of the organic layer;

forming a contact hole in the ion doped layer exposing a portion of the electrode; and forming an inorganic layer connected to the electrode through the contact hole on the ion doped layer.

2. The method of claim 1, wherein the organic layer includes at least one of a C—H and a C—F bond structure.

3. The method of claim 1, wherein the organic layer includes benzo-cyclo-butene.

4. The method of claim 1, wherein the inorganic layer includes an indium tin oxide.

5. The method of claim 1, wherein the step of forming the contact hole is performed prior to the step of forming an ion doped layer.

6. The method of claim 1, further including a step of forming an oxide layer on the ion doped layer by ashing the ion doped layer in an $O_2$ atmosphere.

7. A liquid crystal display device comprising:

a substrate;

a switching element having an electrode on the substrate;

an organic layer over the switching element and the substrate;

an ion doped layer including ions selected from Si, P, Ge, B, As, Ba, Ti, Tb, and Bi in a top portion of the organic layer;

a contact hole in the ion doped layer exposing the electrode; and an inorganic layer connected to the electrode through the contact hole.

8. The liquid crystal display device of claim 7, wherein the organic layer includes at least one of a C—H and a C—F bond structure.

9. The liquid crystal display device of claim 7, wherein the organic layer includes benzo-cyclo-butene.

10. The liquid crystal display device of claim 7, wherein the inorganic layer includes indium tin oxide.

11. The liquid crystal display device of claim 7, wherein the ion doped layer is also formed on side walls of the contact hole.

12. The liquid crystal display device of claim 7, further including an oxide layer on a surface of the ion doped layer.

13. A liquid crystal display device comprising:

an organic layer including at least one of a C—H and a C—F bond structure on a substrate;

a doped layer in a top portion of the organic layer including ions selected from a group of ions consisting of Si, P, Ge, B, As, Ba, Ti, Tb and Bi; and an inorganic layer formed on the doped layer.

14. A method of forming liquid crystal display device comprising the steps of:

forming a thin film transistor having an electrode on a substrate;

forming an organic protection layer over the thin film transistor and the substrate;

doping a surface portion of the organic protection layer with ions selected from a group consisting of Si, P, Ge, B, As, Ba, Ti, Tb, and Bi to form an ion doped layer;

forming a contact hole in the organic protection layer and the ion doped layer to expose the electrode; and forming a pixel electrode in the contact hole and over a portion of the ion doped layer.

15. The method of claim 14, further including a step of forming an oxide layer on the ion doped layer by ashing the ion doped layer in an $O_2$ atmosphere.

16. The method of claim 14, wherein the step of doping a surface portion of the organic protection layer is performed after the step of forming the contact hole.

17. The method of claim 16, wherein the step of doping a surface portion of the organic protection layer includes the step of doping side walls of the contact hole.

18. A method of forming liquid crystal display device comprising the steps of:

forming a thin film transistor having an electrode on a substrate;

forming an organic protection layer over the thin film transistor and the substrate;

doping a surface portion of the organic protection layer with ions selected from a group consisting of Si, P, Ge, B, As, Ba, Ti, Tb, and Bi to form an ion doped layer;

forming a contact hole in the organic protection layer and the ion doped layer to expose the electrode; and forming a pixel electrode in the contact hole and over a portion of the ion doped layer, wherein the step of forming a contact hole in the organic protection layer and the ion doped layer includes the steps of:

forming a first photoresist layer over the ion doped layer;

patterning the first photoresist layer;

removing portions of the ion doped layer and the organic protection layer to form the contact hole; and removing the first photoresist layer.

19. A method of forming liquid crystal display device comprising the steps of:

forming a thin film transistor having an electrode on a substrate;

forming an organic protection layer over the thin film transistor and the substrate;

doping a surface portion of the organic protection layer with ions selected from a group consisting of Si, P, Ge, B, As, Ba, Ti, Tb, and Bi to form an ion doped layer;

forming a contact hole in the organic protection layer and the ion doped layer to expose the electrode; and forming a pixel electrode in the contact hole and over a portion of the ion doped layer, wherein the step of forming a pixel electrode in the contact hole and over a portion of the ion doped layer includes the steps of:

forming an inorganic conductive layer over the ion doped layer and in the contact hole to be in contact with the electrode;

forming a second photoresist layer over the inorganic conductive layer;

patterning the second photoresist layer;

removing exposed portions of the inorganic conductive layer; and removing the second photoresist layer.

* * * * *